AUTOMATIC SWEEP TUNING CIRCUIT WITH MEANS TO CHANGE
THE RANGE OF REACTANCE AFTER EACH
SWEEP THROUGH A SUB-BAND

Filed Dec. 19, 1962 2 Sheets-Sheet 1

INVENTORS
GAROLD K. JENSEN
JAMES E. MC GEOGH
BY Shelton M. Anelly, Agent
Richard C. Reed
ATTORNEY INVENTORS
GAROLD K. JENSEN
JAMES E. MC GEOGH
BY Shelton McAnelly, Agent
Richard C. Reed
ATTORNEY 3,166,726

AUTOMATIC SWEEP TUNING CIRCUIT WITH MEANS TO CHANGE THE RANGE OF REACTANCE AFTER EACH SWEEP THROUGH A SUB-BAND

Garold K. Jensen, Pinecrest, Va., and James E. McGeogh, Silver Spring, Md., assignors to the United States of America as represented by the Secretary of the Navy Filed Dec. 19, 1962, Ser. No. 245,943
4 Claims. (Cl. 334—19)
(Granted under Title 35, U.S. Code (1952), sec. 266)

The invention described herein may be manufactured and used by or for the Government of the United States of America for governmental purposes without the payment of any royalties thereon or therefor.

This invention relates in general to tuned electrical circuits and in particular to automatic tuning circuits of simple reliable structure having a minimum of mechanically operative or critically adjusted parts.

Although narrow range automatic electronic tuning circuits have been available in the prior art, available wide range circuits in general require reversible motor drives and elaborate gearing in which backlash and vibration introduce perpetual difficulties. Such mechanical arrangements also generally involve shifting of the drive arrangements because of different desired characteristics of "search" and "hold" components and tuning rates. Since the usual forms of mechanical devices employed for the present purposes have various disadvantages it is desired to provide a circuit which will avoid certain forms of mechanical components of the prior art which have been found to be troublesome.

It is accordingly an object of the present invention to provide a wide range automatic tuning circuit which avoids complex mechanical components.

Another object of the present invention is to provide a wide range automatic tuning circuit in which the basic "search" component is also the "hold" component, avoiding switching between the different phases of operation.

Another object of the present invention is to provide a wide range automatic tuning circuit requiring a minimum of mechanically operative components.

Other objects and many of the attendant advantages of this invention will be readily appreciated as the same becomes better understood by reference to the following detailed description when considered in connection with the accompanying drawings wherein.

In accordance with the basic features of the present invention an automatic tuning circuit is provided wherein mechanically operative components are held to a minimum by employing a combination of a stepping relay controlling a plurality of capacitances graduated in size and a variable inductor controlled by an electron tube whose anode current is caused to vary in a sawtooth manner to search for a signal of desired frequency and which is varied to hold a signal found despite variations in the frequency of that signal.

Figure 1:
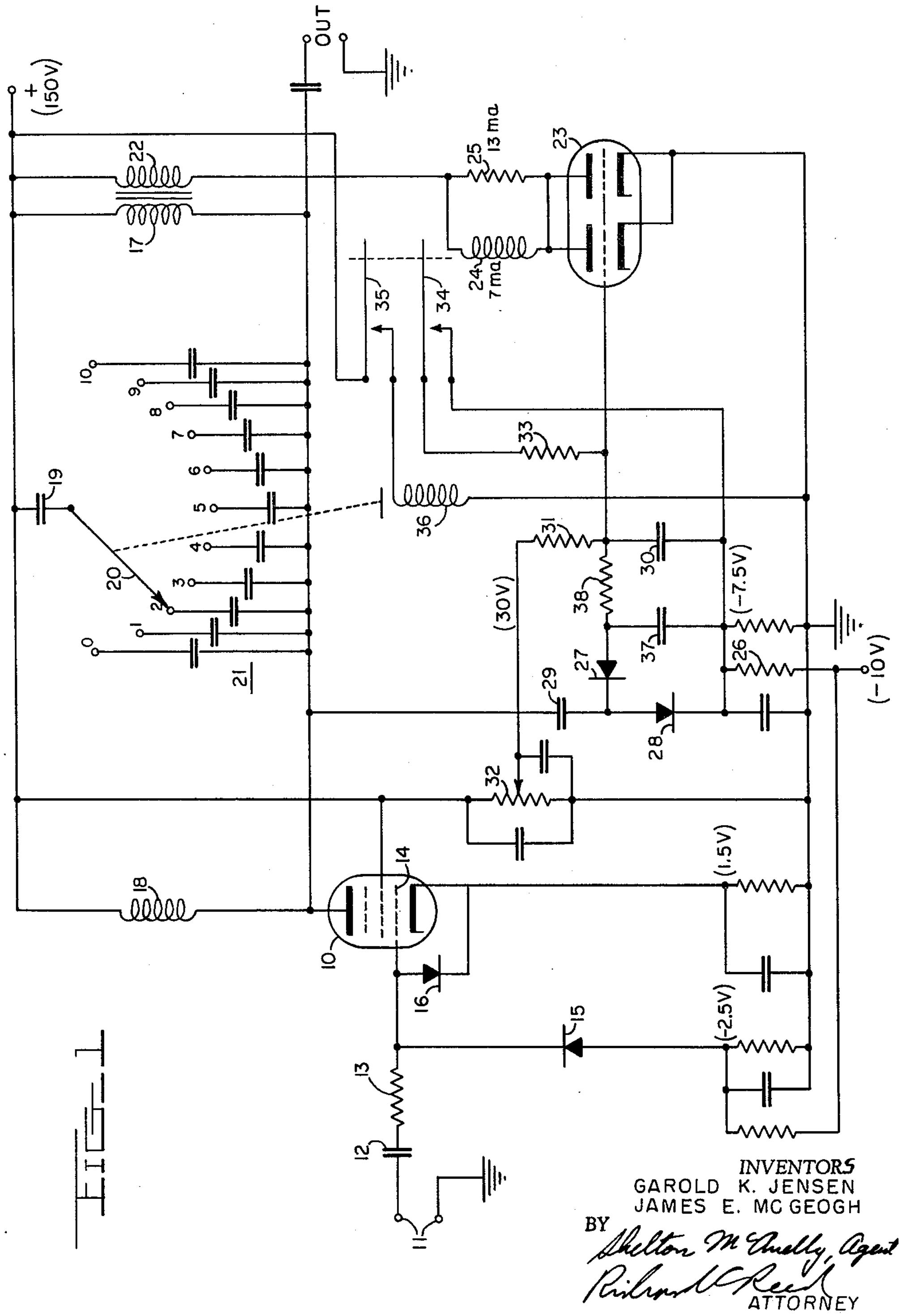
FIG. 1 is a schematic presentation of a typical embodiment of the features of the invention.

With reference now to FIG. 1 of the drawing, the apparatus shown therein contains a first amplifier indicated by the reference character of tube 10. Input signals applied to terminals 11 and which may typically be in the form of a sine wave in the region of 100 to 200 kilocycles and having a peak to peak amplitude of approximately 40 volts are coupled via capacitance 12 and resistance 13 to the grid 14 of the tube 10. Also connected in the grid circuit of tube 10 is diode 15 which is biased by a negative potential of approximately two and a half volts and hence becomes conductive to prevent the grid from going more negative than 2½ volts relative to ground. Additionally, grid 14 is connected to the cathode via unilateral impedance device 16. Effectively this unilateral impedance device 16 prevents grid 14 from rising above the approximately 1½ volts positive potential maintained at the cathode of tube 10 as a result of cathode biasing. The combination of the unilateral impedance devices 15 and 16 and the series limiting resistor 13 provides a square wave generator which applies square wave signals to the grid of tube 14. The current flow in tube 10 is thus of a square wave nature rich in odd multiple harmonics which is desired to secure uniformity of amplitude of operation and also to provide rich harmonic excitation of any tuned circuits connected to the anode of tube 10 should frequency multiplication by odd multiples be desired. Input pulse shaping for multiplication by even factors enhances the even harmonics in tube 10 plate current and may take the form of a full wave rectifier as one example.

The anode of tube 10 is loaded by a parallel resonant circuit consisting of inductance 17 shunted by inductance 18 and by a capacitance made up of capacitance 19 in series with the switch 20 which selects one of a plurality of capacitors indicated in general by reference character 21 and which are of different graduated sizes so as to provide different effective shunting capacitance for the tuned circuit. The gradation of capacitors is normally decreasing from positions zero through 10 of switch 20 in order that the capacitance connected to position zero of switch 20 will be larger than the next, and so forth.

Figure 2:
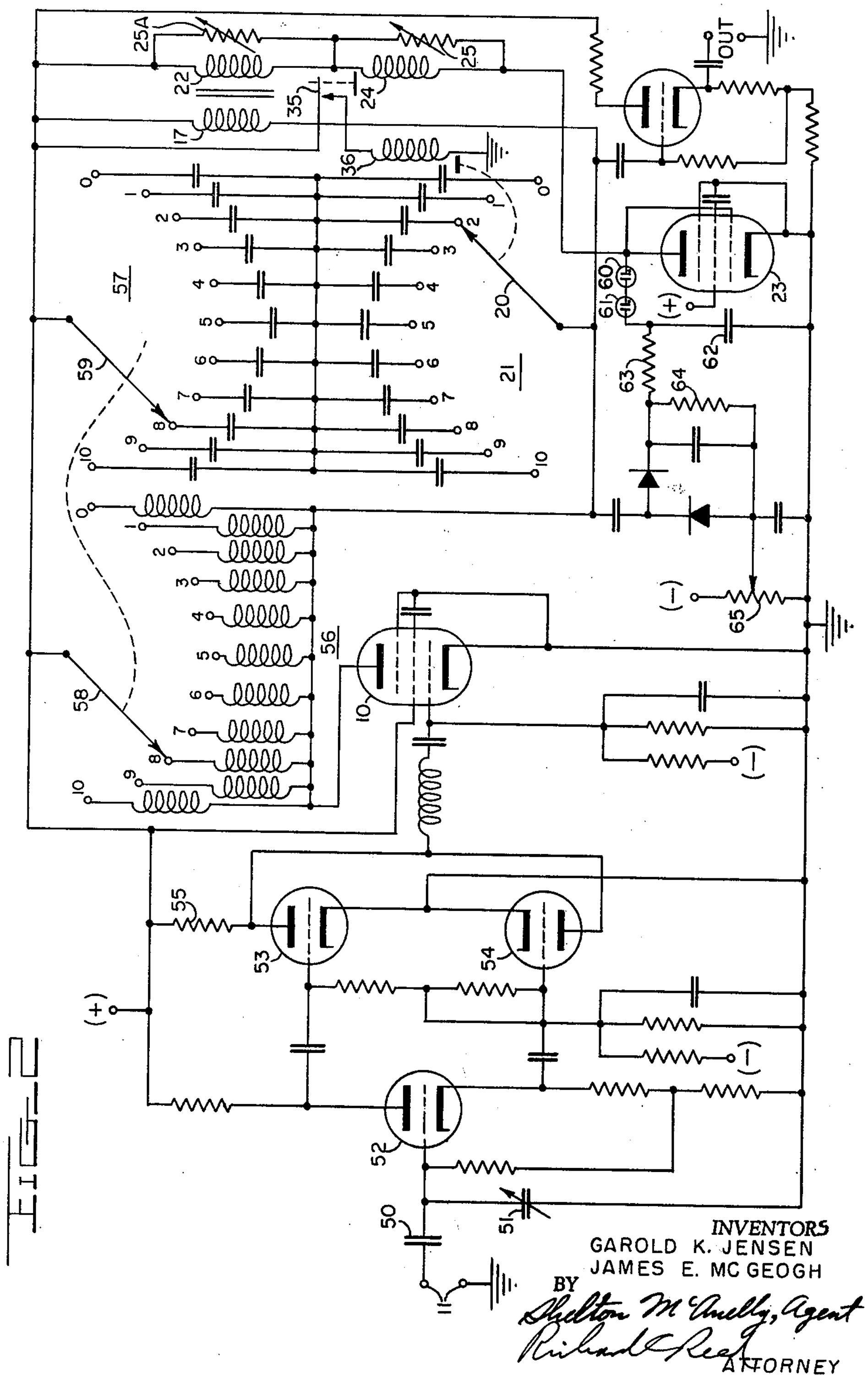
FIG. 2 shows details of a more sophisticated version of the invention.

Capacitors 21 may be selected, if desired, for equal frequency steps over the frequency band which occurs for the largest selected value of capacitor 19. If capacitor 19 is made very large with respect to the values of capacitors 21 the maximum to minimum frequency ratio that can be produced by switching 20 will be the square root of the maximum to minimum capacitor values. This frequency ratio may be reduced by decreasing the size of capacitor 19. The frequency of any step of switch 20 may be readjusted by the proper selection of inductance 18 which could be switched as shown in FIG. 2.

Inductance 17 is a special form of inductance which is variable depending upon the amount of direct current flowing through associated winding 22. By variation of the current flowing through winding 22 it is possible to provide a considerable range of inductance variation in the inductance 17, so much so that in a typical embodiment of this invention it was desired to place the non-variable inductance 18 in shunt with inductance 17.

Normally a higher coil Q is obtainable for the single value inductance 18 than for the current controlled inductance 17. When this is true and the control range of inductance 17 when used as the only inductance can produce a frequency change greater than required, the addition of a high Q coil 18 may be made to provide a higher resultant circuit Q while simultaneously reducing the frequency control range to the necessary amount. Such was desirable to obtain the over-all increased Q provided by the fixed inductance as well as to reduce the tuning range.

Control of the amount of current flowing through winding 22 is effected by electron tube 23 which for convenience is selected as both halves of a dual triode electron tube such as type 12AT7 and which is variably biased for frequency sweeping by a time constant circuit and for frequency holding by signals developed across the tuned circuit in the anode of tube 10.

Control winding 22 is connected to the paralleled anodes of tube 23 through winding 24 of a relay, which winding is shunted by resistance 25 to maintain desired relative operation of components 17 and 24. Further, the cathodes of tube 23 are connected to ground.

The grid biasing voltage for tube 23 is developed from a fixed biasing voltage obtained from a negative supply applied through resistance 26 and is assisted by a signal variable voltage derived by unilateral impedance elements 27 and 28 which are connected through capacitance 29 to the anode of tube 10. In the absence of any substantial amplitude of signal at the anode of tube 10 because of a condition in which the tuned anode circuit is not adjusted to a frequency which is harmonically related to the input at 11, there is no substantial amount of voltage applied through the unilateral impedance elements 27 and 28 so that the potential at the grids of tube 23 receives a time constant produced sawtooth type variational signal derived from the charging and discharging of capacitance 30. Capacitance 30 is charged in a positive direction through resistance 31 which receives approximately 30 volts D.C. from potentiometer 32 connected across the positive supply and ground. Capacitance 30 is shunted by resistance 33 through normally open contacts 34 of relay 24 which contacts are closed upon the energization of relay 24 when a prearranged magnitude of current flow occurs in tube 23.

As a result of this biasing circuit, the voltage across capacitance 30 will vary in a recurrent sawtooth fashion causing a corresponding change in the current flow through tube 23 and control winding 22.

Also operated by the relay 24 is a second set of contacts 35 which control the actuation of coil 36 of stepper switch 20 to produce advancement of the switch 20 by one position upon each closure of the contacts 35, selecting each time a smaller capacitance 21 to increase the frequency of the tuned circuit.

In operation, then, it is to be noted that the circuit will begin with an initial typical zero position of switch 20 and a low voltage at the grid of tube 23. As the voltage of the grid of tube 23 rises because of the charging of capacitance 30, current through relay coil 24 and control coil 22 will increase in a sawtooth manner to provide a gradual reduction of the inductance 17 to produce a corresponding increase in the resonant frequency of the circuit connected to the anode of tube 10. This gradual increase in frequency of the resonant circuit continues until the current is sufficient to actuate relay 24 closing the contacts 34 and 35 and thereby advancing the switch 20 from the zero to the 1 position. Simultaneously with this, capacitor 30 is discharged to provide a return to the low current condition through relay coil 24 and control winding 22.

With the capacitance connected to position 1 of switch 20 being smaller than that connected to position zero, a gradual frequency increase again occurs but this time between higher frequencies and which terminates when the current of tube 23 actuates relay coil 24 to produce a second step in the position of switch 20, namely, to the 2 position.

This frequency sweep action continues until the resonant circuit connected to the anode of tube 10 reaches either the fundamental or some higher order harmonic of the input signal at terminals 11. When this fundamental or harmonic condition is realized it is accompanied by the development of signals of substantial amplitude at the anode of tube 10 which signals when coupled through capacitance 29, rectified by unilateral impedance elements 27 and 28, filtered by a capacitance 37 and resistance 38 provide an additional variational control voltage for capacitance 30. Normally because of the polarities of the unilateral impedance elements 27 and 28 this will be a negative potential tending to counteract the positive charging current applied through resistance 31 so that the former gradual increase of potential across capacitance 30 is altered and even reversed. This causes a stabilization of the voltage at the grid of tube 23 accompanied by a stabilization of the current in winding 22 which terminates the frequency sweeping action of the resonant circuit and provides immediate effective control of frequency which will follow subsequent changes in frequency in the signal applied to terminals 11.

Such input frequency changes in an increasing frequency direction are readily accomplished with the circuit operating in the sweep manner just described, however, large decreases in frequency in the signal applied to 11 may result in a requirement for the resonant circuit to be driven below the range possible for the particular value of capacitance 21 than in use. As the amplitude of signals in the resonant circuit then decreases due to the off-time condition, the negative rectified signals obtained through resistance 38 are no longer adequate to offset the positive charging through resistance 31, which positive charging rapidly completely detunes the circuit. This results in the resumption of the stepwise charging of capacitance 30 and stepwise operation of switch 20 which continues until another harmonic of the input signal at 11 is reached or if the circuit is purposely limited so that this is not possible, when the switch 20 reaches its final position 10 so that the next actuation or relay 24 will result in the mechanical return of switch 20 to the zero position. This produces a recurrence of the complete sweeping operation beginning at the low frequency end of the range so that it will be possible to lock on at the lower frequency required for the reduced frequency of the signal at the input terminal 11.

With reference now to FIG. 2 of the drawing, the apparatus shown therein contains several variations intended to emphasize certain additional basic features of the present invention. While the apparatus of FIG. 1 with the square wave clipping components 13, 15, and 16 was intended to drive tube 10 with a square wave signal rich in odd harmonics and virtually devoid of even harmonics which is desirable for frequency multiplication by an odd factor, including unity, circuit operation at an even multiplication factor, such as 2, 4, 6, etc., is facilitated by driving the tube 10 with a wave form rich in even harmonics and virtually devoid of fundamental and odd harmonics. To this end the same sinusoidal signal is applied to terminals 11 of FIG. 2 and taken through a capacity voltage divider consisting of capacitances 50 and 51 for application to the phase inverter circuit of tube 52. With substantially equal amplitude and opposite polarity sinusoidal signals being obtained at the anode and cathode of tube 52 it is possible to drive the tubes 53 and 54 with the grids being operated in push-pull and the anodes being tied together with a common load resistor 55 to obtain the waveform characteristic of the full wave rectifier. This waveform, which is free of fundamental and odd harmonics, is applied to drive tube 10 which substantially corresponds to the tube of the same reference character of FIG. 1.

In the apparatus of FIG. 2, a plurality of inductances 56 replaces the single inductance 18 of FIG. 1 and a plurality of capacitances 57 replaces the single capacitance 19 of FIG. 1. Capacitance bank 21 indicated in FIG. 2 substantially corresponds to the structure bearing the same reference character of FIG. 1. Switch 58 selects one of the inductances from the bank 56 whereas switch 59 selects one of the capacitances from the bank 57. Switches 58 and 59 are preferably ganged to provide a "coarse" frequency setting and may be manipulated by hand, for example, if so desired.

The purpose of the plurality of inductances 56 is to provide for changing the effective tuning range of the inductance 17 as various frequency steps are selected while the bank of capacitances 57 changes the effective value of the capacitances 21 for the different tuning ranges. This refinement of inductance bank 56 and capacitance bank 57 accommodates the very substantial difference in ranges required when the circuit is used in purposes such as frequency decades devices where the first step of the decade may cover an extremely wide ratio of frequencies from top to bottom, say from 100 to 200 kilocycles, while the ultimate step of the same bank would cover the same total frequency range but in a different region, say from 900 kilocycles to 1 megacycle so that the ratio of maximum frequency to minimum frequency of the different steps is different by a factor approaching 10 to 1.

Control of the inductance 17 is accomplished by winding 22, current through which is under control of tube 23. Tube 23 in FIG. 2 is shown as of a pentode type while the mechanical switching action of contacts 34 of FIG. 1 is replaced by a wholly electronic operation connected with tube 23 of FIG. 2. This electronic operation is provided by the gas discharge tubes 60 and 61 which are connected in a form of relaxation circuit with capacitance 62 to generate a sawtooth wave across capacitance 62. In general this waveform corresponds to that produced across capacitance 30 of FIG. 1, however, instead of having the slowly changing portion moving in a positive direction as in FIG. 1, in FIG. 2 the change is in a negative direction by virtue of the connection of resistance 63 through resistance 64 to potentiometer 65 which latter element is placed across a negative source of potential.

As capacitance 62 charges so that the junction thereof with resistance 63 becomes increasingly negative, tube 23 is driven to decreasing conduction which is accompanied by a decrease in the amount of current flowing through winding 22 and an increase in the potential at the anode of tube 23. This change can continue for only so long, however, because eventually, due to the dropping potential at the junction of the capacitance 62 and resistance 63 and the increase in the potential at the anode of tube 23, one of the gas tubes 60 or 61 will ignite, which will immediately place a sudden increase in voltage across the other so that it will ignite almost simultaneously. This ignition of gas tubes 60 and 61 will produce a rapid charging of capacitor 62 in a positive going sense to produce the flyback portion of the sawtooth waveform. It is thus seen that with the operation thus far described, the current in tube 23 will vary in a sawtooth manner providing the same sort of operation which occurred in the tube 23 of FIG. 1. Again it must be observed that the linearly changing portion of the sawtooth is in a different polarity in FIG. 2 from that which it was in FIG. 1. This is merely a matter of choice since it could have been done otherwise but was selected for this purpose to broaden the basic illustration provided by the present disclosure.

The sawtooth signal provides the sweeping action of a single capacitance of bank 21 which, of course, is similar to that which occurs in FIG. 1. To provide a plurality of steps of operation to cover a wider frequency range, the switch 20 under control of relay 36 is actuated through by contacts 35 of relay 24 and the plate circuit of tube 23. In this instance relay 24 does not require contacts 34 which were required in FIG. 1. As before, also, relay coil 24 is shunted by a resistance 25 to secure a desired relationship in the actuation of switch 20 to the current variation coil 22 and resultant effect on the inductance of coil 17. Resistance 25 is assisted in this regard by an additional resistance 25–A.

It is observed that the switches 58, 59, and 20 are shown as of the stepper type in which rotation of the contacts through an arc of less than 360° occurs, following which reset, which can be mechanical, takes place to re-establish the zero condition. It is to be understood that there are other suitable, if not even occasionally preferable forms of stepper relays available such as those that operate stepwise continuously through 360° without requiring any specific reset to some initial position.

A significant advantage of the electronic searching circuit of FIG. 2 is its rapidity of operation. Actually in certain devices constructed in accordance with the invention it was found practical to accomplish each sweeping search action of the tube 23, and coil 17 in a typical one millisecond interval of time. With such rapid sweeping available the mechanical switches such as 20 become more the limiting factor as to speed of operation. It is thus usually desired to select switches such as the 360 degree continuous rotary which will operate at high speed.

Obviously many modifications and variations of the present invention are possible in the light of the above teachings. It is therefore to be understood that within the scope of the appended claims the invention may be practiced otherwise than as specifically described.

What is claimed is:

1. A tunable electrical circuit comprising,
   - a variable reactance device sensitive to a control signal to provide reactance variation in accordance with the control signal,
   - means for producing a basic control signal to sweep said device over a range of reactance at a selected recurrence frequency,
   - signal amplitude responsive means for developing an auxiliary control signal in dependency on signals resulting in the tunable circuit when said device reaches a selected critical reactance,
   - means for applying said auxiliary control signal to the variable reactance device to change the reactance of said device in the opposite sense from that provided by the basic control signal in a selected portion of the basic control signal, and
   - means for providing a stepwise reactance change in the circuit at the end of the sweep of the range of reactance whereby a greater total range of reactance variation than that due to variable reactance device above is accommodated.

2. A tunable inductance-capacitance frequency selective circuit comprising,
   - a variable inductance sensitive to a control signal to provide inductance variation in accordance with the control signal,
   - means for producing a basic control signal to sweep said inductance over a range of inductance at a selected recurrence frequency,
   - signal amplitude responsive means for developing an auxiliary control signal in dependency on signals resulting in the tunable circuit when said variable inductance reaches a selected critical inductance,
   - means for applying said auxiliary control signal to said variable inductance to change the inductance thereof in the opposite sense from that provided by the basic control signal in a selected portion of the basic control signal, and
   - means for providing a stepwise reactance change in the circuit at the end of the sweep of the range of inductance whereby a greater total range of reactance variation is possible in the circuit than that due to the variable inductance alone.

3. A parallel resonant tunable circuit device comprising,
   - a variable inductance sensitive to a control signal to provide inductance variation in accordance with the control signal,
   - means for producing a basic control signal to sweep said inductance over a range of inductance at a selected recurrence frequency,
   - signal amplitude responsive means for developing an auxiliary control signal in dependency on the amplitude of signals developed across the variable inductance,
   - means for applying said auxiliary control signal to said variable inductance to change the inductance thereof in the opposite sense from that provided by the basic control in a selected portion of the basic control signal,
   - a modifying inductance connected to said variable inductance to modify the range of tuning of the circuit from that available with the variable inductance alone,
   - a plurality of capacitances, and
   - a stepper relay for connecting said capacitances to said variable inductance to provide a recurrent stepwise variation of capacitance of the circuit, said stepper relay being connected to said first named means whereby the relay advances one step for each sweep of said variable inductance.

4. A tunable electrical circuit comprising, a variable reactance device sensitive to a control signal to provide reactance variation in accordance with the control signal, means for producing a basic control signal to sweep said device over a range of reactance at a selected recurrence frequency, means to change said range of reactance after each sweep, and signal amplitude responsive bias developing means for developing an auxiliary control signal in opposition to the basic control signal to stop said recurrent sweep when said device reaches a selected critical reactance.

References Cited by the Examiner

UNITED STATES PATENTS 2,601,384 6/52 Goodrich ------------- 334—13

HERMAN KARL SAALBACH, *Primary Examiner.*